(12) United States Patent
Lu et al.

(10) Patent No.: US 11,402,743 B2
(45) Date of Patent: Aug. 2, 2022

(54) MASK DEFECT PREVENTION

(71) Applicant: Taiwan Semiconductor Manufacturing Co., Ltd., Hsinchu (TW)

(72) Inventors: Chi-Ta Lu, Yilan County (TW); Chih-Chiang Tu, Tauyen (TW); Cheng-Ming Lin, Yunlin County (TW); Ching-Yueh Chen, Hsinchu (TW); Wei-Chung Hu, Hsinchu (TW); Ting-Chang Hsu, Hsinchu (TW); Yu-Tung Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 119 days.

(21) Appl. No.: 17/007,920

(22) Filed: Aug. 31, 2020

(65) Prior Publication Data

US 2022/0066312 A1   Mar. 3, 2022

(51) Int. Cl.
| | | |
|---|---|---|
| *G03F 1/24* | (2012.01) | |
| *G03F 1/54* | (2012.01) | |
| *G03F 1/36* | (2012.01) | |
| *G03F 1/64* | (2012.01) | |
| *G03F 1/38* | (2012.01) | |
| *G03F 7/20* | (2006.01) | |

(52) U.S. Cl.
CPC ............... *G03F 1/24* (2013.01); *G03F 1/36* (2013.01); *G03F 1/38* (2013.01); *G03F 1/54* (2013.01); *G03F 1/64* (2013.01); *G03F 7/2004* (2013.01)

(58) Field of Classification Search
CPC ..... G03F 1/24; G03F 1/36; G03F 1/38; G03F 1/54; G03F 1/64; G03F 7/2004
USPC ............................................................ 430/5
See application file for complete search history.

(56) References Cited

U.S. PATENT DOCUMENTS

| 6,492,067 B1 | 12/2002 | Klebanoff et al. |
| 2017/0053058 A1 | 2/2017 | Yu et al. |

FOREIGN PATENT DOCUMENTS

| CN | 1761913 A | 4/2006 |
| CN | 108132585 A | 6/2016 |
| JP | 5821397 B2 | 11/2015 |
| TW | I418940 B | 12/2013 |
| TW | 201435485 A | 9/2014 |
| TW | I592737 B | 7/2017 |
| TW | 201732446 A | 9/2017 |
| TW | 201842208 A | 12/2018 |

*Primary Examiner* — Christopher G Young
(74) *Attorney, Agent, or Firm* — Haynes and Boone, LLP

(57) ABSTRACT

A photolithographic mask assembly according to the present disclosure accompanies a photolithographic mask. The photolithographic mask includes a capping layer over a substrate and an absorber layer disposed over the capping layer. The absorber layer includes a first main feature area, a second main feature area, and a venting feature area disposed between the first main feature area and the second main feature area. The venting feature area includes a plurality of venting features.

20 Claims, 12 Drawing Sheets

MASK DEFECT PREVENTION

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

For example, traditional transmissive photolithography is being supplemented or replaced with reflective photolithography. ICs are typically assembled by layering features on a semiconductor substrate using a set of photolithographic masks. Transmissive masks have patterns formed by transmissive regions. During photolithographic exposure, radiation, such as ultraviolet light, passes through the transmissive regions of the mask before striking a photoresist coating on the substrate. The mask transfers the pattern onto the photoresist. In contrast, a reflective mask includes reflective and non-reflective regions. During exposure, the light reflected off the mask is used to form the pattern on the substrate. After either type of exposure, the photoresist is selectively removed to reveal the pattern. The substrate then undergoes processing steps that take advantage of the shape of the remaining photoresist to create circuit features on the substrate. When the processing steps are complete, photoresist is re-applied and substrate is exposed using the next mask. In this way, features are layered to produce the final circuit.

Reflective masks are advantageous in many applications because they can be used in conjunction with relatively higher frequency radiation such as extreme ultraviolet (EUV) radiation. Reflective masks for EUV radiation includes a mask substrate, a reflective layer over the mask substrate to serve as a mirror, and an EUV absorber layer over the reflective layer. The EUV absorber layer is patterned to selectively expose the underlying reflective layer such that incident EUV radiation is absorbed by the remaining EUV absorber layer but is reflected by the exposed reflective layer. Conventional reflective masks for EUV radiation include pattern-free areas where a continuous span of EUV absorber layer is without any pattern. Exposure to EUV radiation may cause bubbling or even delamination in the pattern-free areas, impacting the quality and lifetime of the mask. Therefore, while existing reflective masks and reflective lithography are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
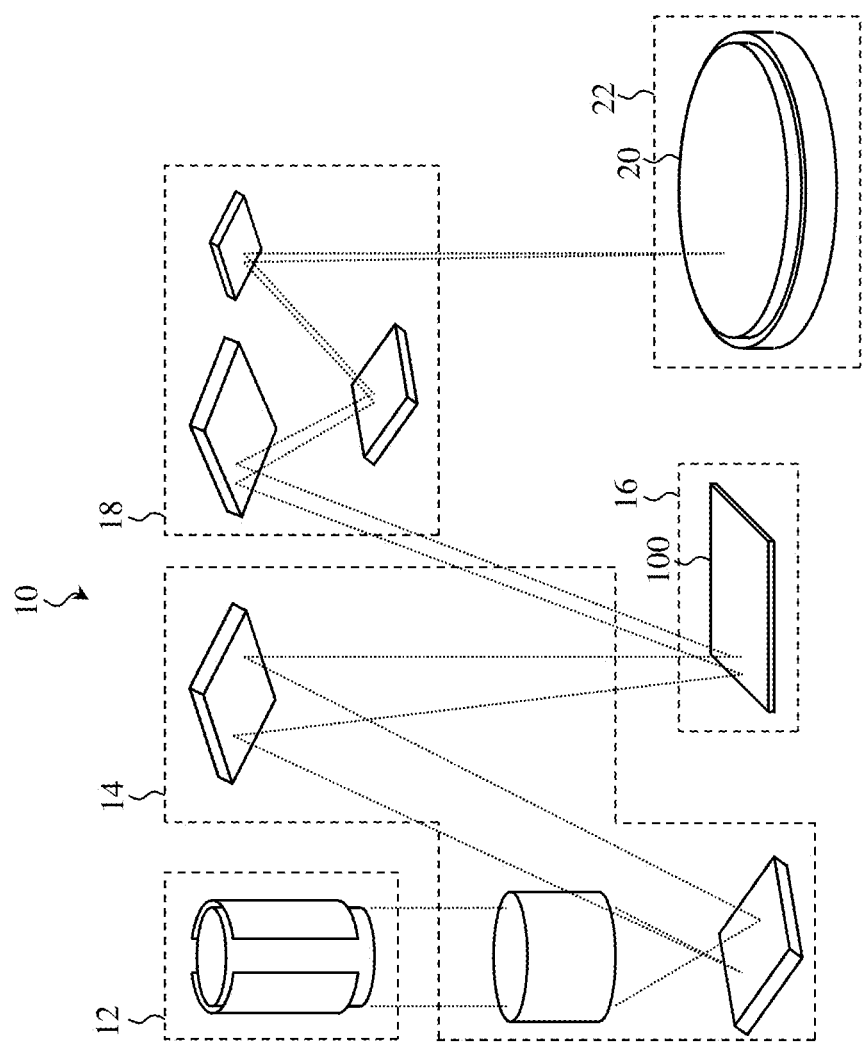
FIG. 1 is a block diagram of a lithography system operable to perform a photolithographic technique according to various aspects of the present disclosure.

The present disclosure relates generally to reflective masks for IC device manufacturing and, more particularly, to a reflective mask with venting features to prevent reflective mask defects.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Reflective masks have been adopted for state-of-the-art photolithography radiation sources, such as an extreme ultraviolet (EUV) radiation source. A reflective mask for EUV radiation source includes a mask substrate, a reflective layer over the mask substrate, and an EUV absorber layer over the reflective layer. The EUV absorber layer is patterned to selectively expose the underlying reflective layer such that incident EUV radiation is absorbed by the remaining EUV absorber layer but is reflected by the exposed reflective layer. A reflective mask may include a plurality of main feature areas, each of which includes EUV absorber patterns that will print on a photoresist-borne workpiece. In that regard, the plurality of main feature areas may also be referred to as printing feature areas. Each of the plurality of main feature areas may be defined within or surrounded by pattern-free areas, where the EUV absorber layer is not patterned. Adjacent main feature areas are spaced apart by pattern-free areas. In addition, pattern-free areas may be present between edges of the reflective mask and the main feature areas. The pattern-free areas between edges of the reflective mask and the main feature areas may be or include the so-called black border areas. When an EUV reflective mask is protected by a pellicle on a pellicle frame, the black border area that is not covered by the pellicle frame may be situated between one or more main feature areas and the opening edge of the pellicle frame. In some instances, pattern-free areas of various sizes may also be present in the plurality of main feature areas. It has been observed that bubbles may be developed in the EUV absorber layer in pattern-free areas but are rarely observed in the areas with dense patterns. Although the mechanism of bubble generation is still under investigation, evidence suggests that the bubbling may be caused by vaporization of compounds intentionally or unintentionally incorporated in the EUV absorber layer. Such compounds may include, for example, water. It has been theorized that when these compounds vaporize and cannot escape due to the continuous EUV absorber layer in the pattern-free areas, the vaporized compounds would cause bubbling under the EUV absorber layer. When more and more bubbles form, they may coalesce to become a larger bubble. Larger bubbles may further coalesce to form a pocket, leading to delamination of the EUV absorber layer. Increase in energy of the EUV radiation source may exacerbate bubbling and accelerate delamination. Therefore, bubbling may be source of defects in an EUV reflective mask and may also shorten the lifetime of an EUV reflective mask.

The present disclosure provides methods and mask designs to reduce defects in the EUV reflective masks and improve their lifetime. Methods of the present disclosure may identify venting feature insertion areas in a mask design and insert venting features in the venting feature insertion areas. As their name suggests, the venting features are openings in the EUV absorber layer to provide outlets for vaporized compounds, thereby preventing bubbling and delamination. Depending on their locations within or without the main feature areas, the venting features may be non-printing (sub-resolution) or printing features. For example, if venting features are inserted into main feature areas, they may be non-printing features. However, if venting features are only inserted into pattern-free areas outside the main feature areas, they may be printing features or non-printing features.

A schematic diagram of a lithography system 10 is illustrated in FIG. 1. The lithography system 10, which may also be generically referred to as a scanner, is operable to perform a lithographic exposure process. In the illustrated embodiments, the lithography system 10 is an extreme ultraviolet (EUV) lithography system designed to expose a workpiece using EUV radiation having a wavelength ranging between about 1 nm and about 100 nm. In some exemplary embodiments, the lithography system 10 includes a radiation source 12 that generates EUV radiation with a wavelength centered at about 13.5 nm. In one such embodiment, the radiation source 12 utilizes laser-produced plasma (LPP) to generate the EUV radiation by heating a medium such as droplets of tin into a high-temperature plasma using a laser. The lithography system 10 may also include an illuminator 14 that focuses and shapes the radiation produced by the radiation source 12. The illuminator 14 may include refractive optical components, including monolithic lenses and/or array lenses (e.g., zone plates), and may include reflective optical components, including monolithic mirrors and/or mirror arrays. The number of optical components shown FIG. 1 have been reduced for clarity, although in actual embodiments, the illuminator 14 includes dozens or even hundreds of lenses and/or mirrors. The optical components are arranged and aligned to project radiation emitted by the radiation source 12 onto a mask 100 retained on a mask stage 16. The optical components of the illuminator 14 may also shape the radiation along the light path in order to produce a particular illumination pattern upon the mask 100.

After reflecting off the mask 100, the radiation is directed through a projection optics module 18, also referred to as a projection optics box (POB). Similar to the illuminator 14, the projection optics module 18 may include refractive optical components, including monolithic lenses and/or array lenses (e.g., zone plates), and may include reflective optical components, including monolithic mirrors and/or mirror arrays. The optical components of the projection optics module 18 are arranged and aligned to direct radiation reflecting off the mask 100 and to project it onto a workpiece 20, such as the illustrated semiconductor substrate or any other suitable workpiece, retained in a substrate stage 22. In addition to guiding the radiation, the optical components of the projection optics module 18 may also enlarge, narrow, focus, and/or otherwise shape the radiation along the light path. Radiation projected by the projection optics module 18 on the workpiece 20 causes changes in a photosensitive component of the target. In a common example, the workpiece 20 includes a semiconductor substrate with a photosensitive resist layer. Portions of the photosensitive resist layer that are exposed to the radiation undergo a chemical transition making them either more or less sensitive to a developing process. In an exemplary embodiment, after exposure, the photosensitive resist layer undergoes a post-exposure baking, developing, rinsing, and drying in order to complete the transition. Subsequent processing steps performed on the semiconductor substrate may use the pattern to selectively process portions of the substrate.

Figure 2:
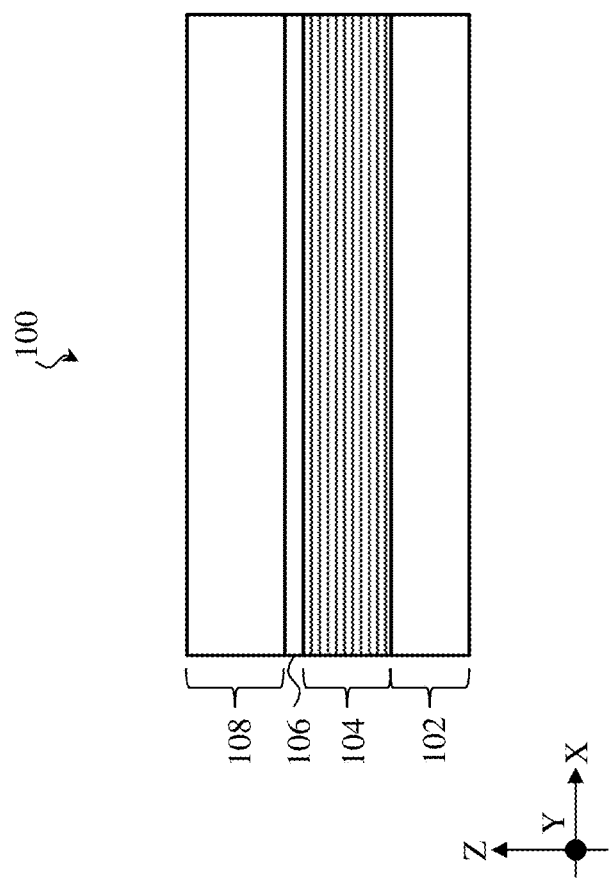
FIG. 2 is a fragmentary cross-sectional diagram of a mask substrate according to various aspects of the present disclosure.

The mask 100 may have a construction illustrated in FIG. 2. In some embodiments, the mask 100 includes a substrate 102 with a reflector (or a reflective layer) such as a multi-layer mirror (MLM) 104 disposed on the substrate 102. In turn, an absorptive layer 108 is disposed on the MLM 104. The composition of the substrate 102, the MLM 104, and the absorptive layer 108 are described in detail below. However, at a high level, regions of the mask 100 where the absorptive layer 108 is present absorb incident radiation, whereas regions of the mask 100 where the absorptive layer 108 is not present reflect incident radiation towards a target.

The substrate 102 commonly includes a low thermal expansion material (LTEM). Exemplary low thermal expansion materials include quartz as well as LTEM glass, silicon, silicon carbide, silicon oxide, titanium oxide, Black Diamond® (a trademark of Applied Materials), and/or other low thermal expansion substances known in the art. To support the substrate 102, a chucking layer such as an electrostatic chucking layer or a mechanical chuck may be attached to the back side of the substrate 102. Exemplary electrostatic chucking layer materials include chromium nitride (CrN), chromium oxynitride (CrON), chromium (Cr), tantalum boron nitride (TaBN), and tantalum silicide (TaSi). The MLM 104 is disposed over the front side of the substrate 102. The MLM 104 is a typical example of a reflective structure that is well-suited to EUV radiation. Rather than a single reflective surface, an MLM includes a number of alternating material layers. Typical numbers of alternating pairs range from 20 to 80, although the MLM 104 may include any number of pairs. The number of layers, the layer thickness, and the layers materials are selected to provide the desired reflectivity based on the exposure radiation and its properties such as wavelength and/or angle of incidence. For example, layer thickness may be tailored to achieve maximum constructive interference of EUV radiation reflected at each interface of the film pairs while achieving a minimum absorption of extreme ultraviolet radiation by the MLM 104. Likewise, the materials used for each alternating pair may be selected based on their refractive index. In an exemplary embodiment, the MLM 104 includes forty pairs of alternating molybdenum and silicon (Mo—Si) layers. In a further exemplary embodiment, the MLM 104 includes sixty pairs of alternating molybdenum and beryllium (Mo—Be) layers.

A capping layer 106 (also known as a buffer layer) may be disposed over the MLM 104. In an embodiment, the capping layer 106 protects the MLM 104 during an etching and/or repair process. The capping layer 106 may include materials such as ruthenium (Ru), silicon dioxide ($SiO_2$), and/or amorphous carbon. The absorptive layer 108 is disposed on the capping layer 106 and may include chromium (Cr), tantalum nitride (TaN), tantalum oxide (TaO), tantalum boron nitride (TaBN), titanium nitride (TiN), combinations thereof, and/or other suitable absorptive materials. In some embodiments, the absorptive layer 110 contains multiple layers of absorptive material, for example, layers of chromium and layers of tantalum nitride. The absorptive layer 110 may also include an anti-reflective coating (ARC). Suitable ARC materials include tantalum boron oxide (TaBO), chromium oxide ($Cr_2O_3$), silicon oxide ($SiO_2$), silicon nitride (SiN), tantalum oxide ($TaO_5$), tantalum oxynitride (TaON), and/or other suitable materials. The MLM 104, the capping layer 106, and the absorptive layer 108 may be disposed on the substrate 102 by various methods, including physical vapor deposition (PVD) processes such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, and/or other methods known in the art. In an embodiment, the absorptive layer 108 is deposited by a sputtering deposition technique to achieve a controlled thickness and uniformity with relatively low defects and good adhesion. The compositions and/or physical structures of one or more layers described above may be selected based upon reflectivity/absorption of the radiation to be used with the mask 100, the stress compatibility with adjacent layers, and/or other criteria known in the art.

Figure 3:
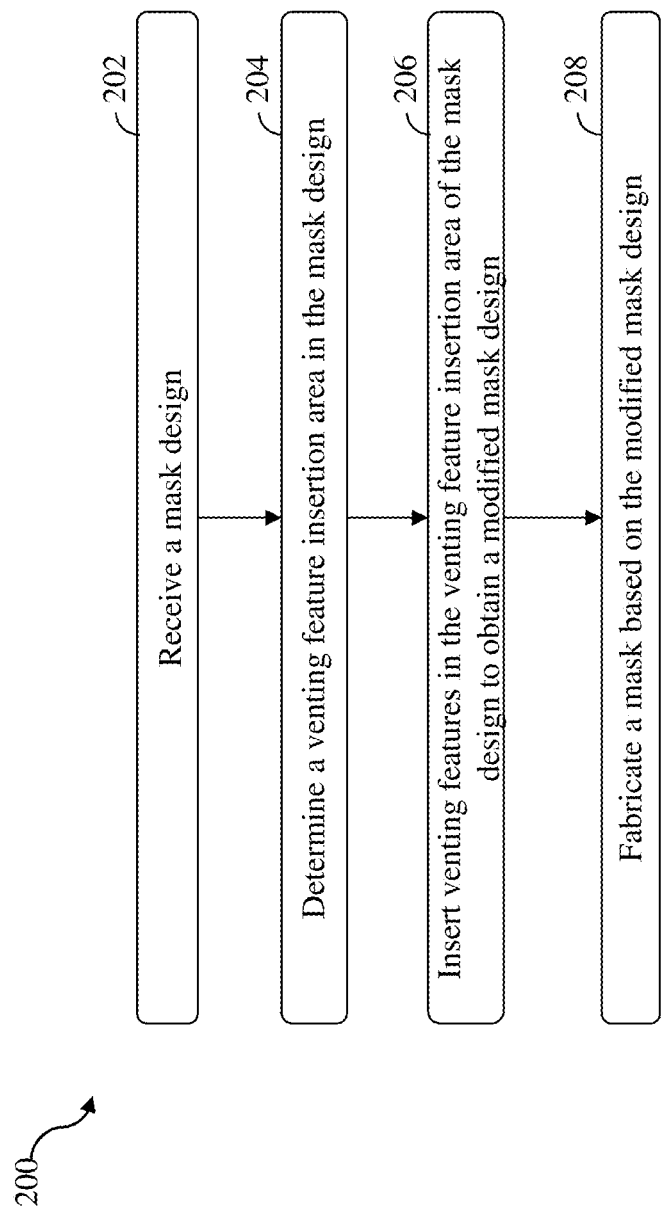
FIG. 3 is a flow diagram of a method of manufacturing a reflective mask for exposing a negative-type photoresist according to various aspects of the present disclosure.

As described above, when the absorptive layer 108 extends continuously in a pattern-free area, vapor of compounds in the absorptive layer 108 or the capping layer 106 may not readily escape and may form bubbles under the absorptive layer 108. FIG. 3 is a flow chart of a method 200 for inserting venting features in the mask 100. Operations of the method 200 will be described below in conjunction with FIGS. 4, 5A, 5B, 6A, 6B, 7A, 7B, 7C, 8, and 9. It is understood that additional steps can be provided before, during, and after the method 200, and some of the steps described can be replaced or eliminated for other embodiments of the method 200.

Figure 4:
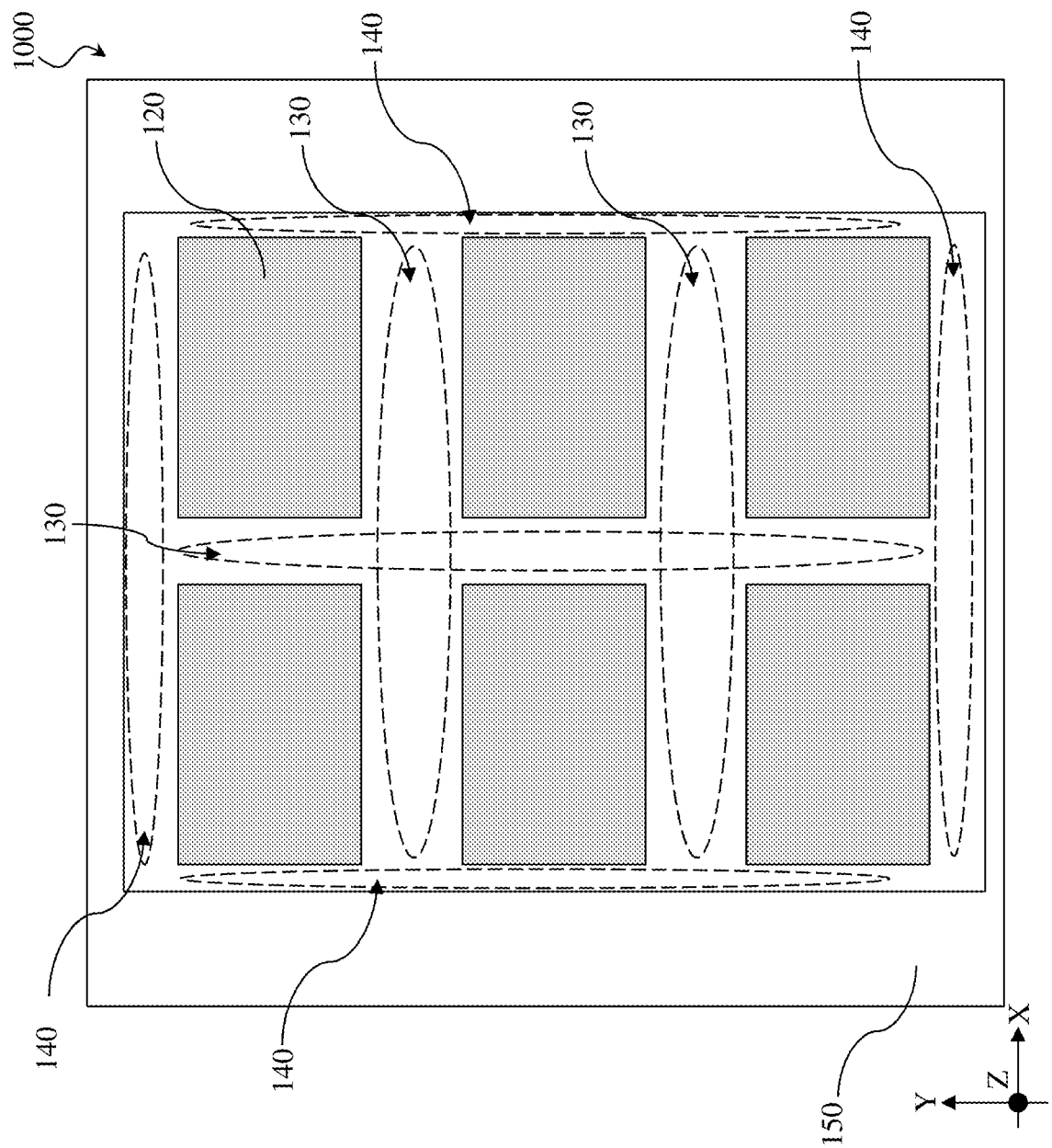
FIGS. 4, 5A, 5B, 6A, 6B, and 8 are fragmentary top views of a mask substrate undergoing operation of the method of FIG. 3, according to various aspects of the present disclosure.

Referring to FIGS. 3 and 4, method 200 includes a block 202 where a mask design 1000 is received. In some embodiments, the mask design 1000 includes main feature areas 120, each of which includes patterns of printing features in the absorber layer. Although FIG. 4 illustrates six rectangular main feature areas 120, the present disclosure is not so limited. A mask design 1000 according to embodiments of the present disclosure may include more than 6 main feature areas and each of the main feature areas may include a polygonal shape, such as a square or a rectangle. In addition, the main feature areas 120 may not be aligned along the X and Y directions as illustrated in FIG. 4. Each of the main feature areas 120 may be defined within and surrounded by pattern-free areas between adjacent main feature areas 120 or around the edge of the mask design 1000. As describe above with respect to FIG. 2, each of the main feature areas 120 include dense printing patterns in the absorber layer while the absorber layer in the pattern-free areas is free of patterns. For ease of reference, pattern-free areas in the margin of the mask design 1000 may be referred to as black border areas 140 and pattern-free areas between adjacent main feature areas 120 may be referred to as divider areas 130. While not explicitly shown in FIG. 4, each of the main feature areas 120 may also include pattern-free areas. The black border areas 140 may be exposed in an opening of a pellicle frame 150 representatively shown in FIG. 4. With reference to the pellicle frame 150, the black border areas 140 are disposed between main feature areas 120 and edges of the opening of the pellicle frame 150.

Figure 5A:
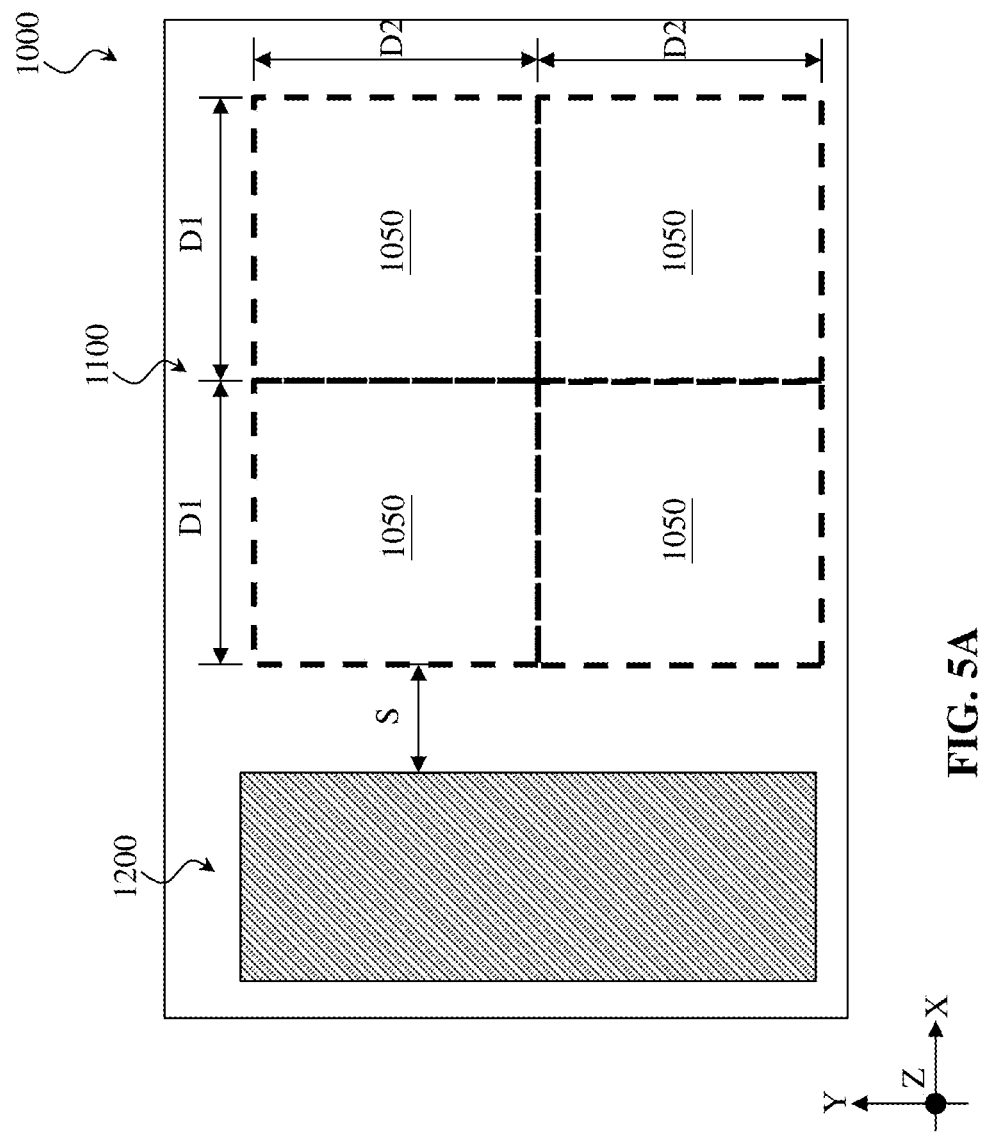
Figure 5B:
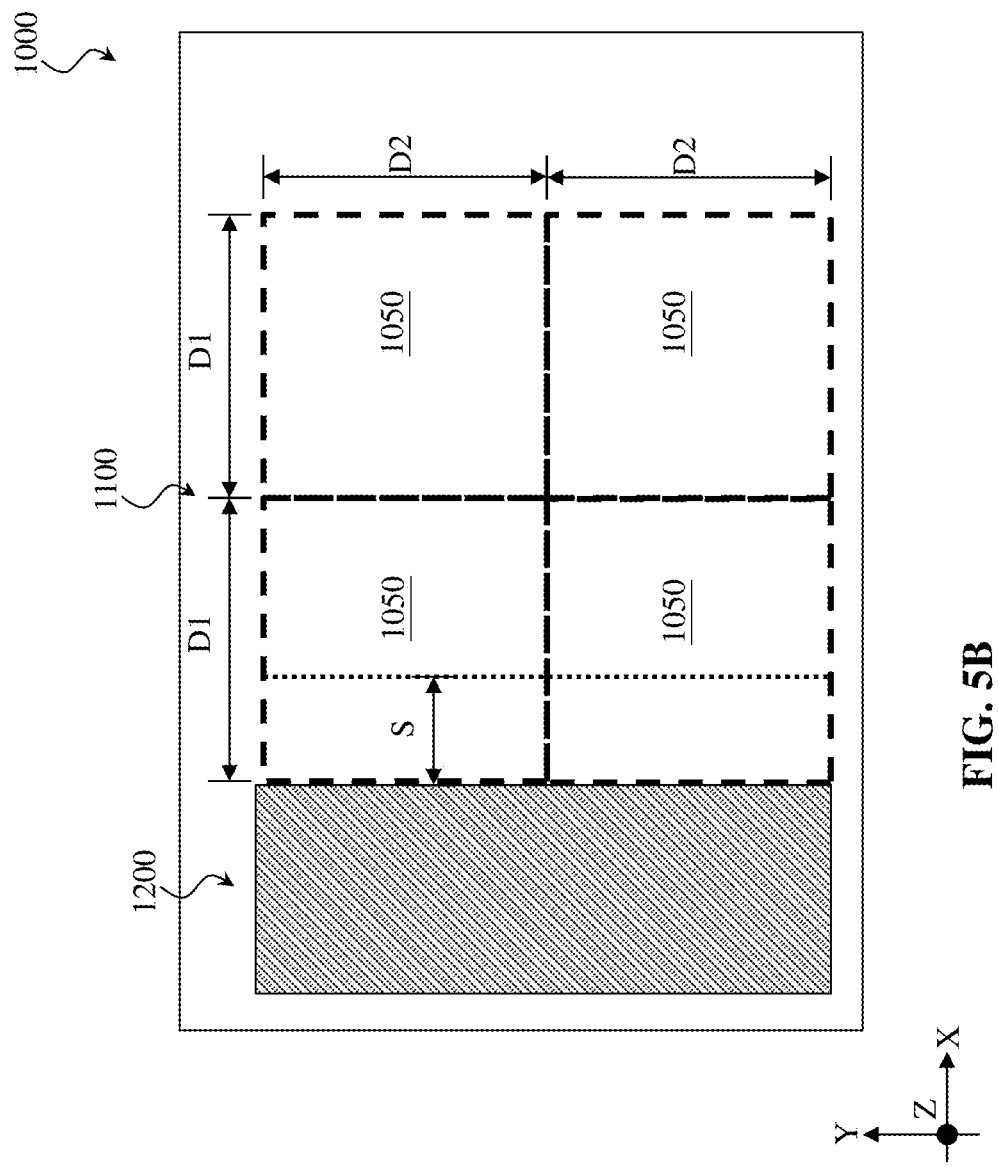

Referring to FIGS. 3, 5A and 5B, method 200 includes a block 204 where a venting feature insertion area 1100 in the mask design 1000 is determined. In some embodiments, a venting feature insertion area 1100 is determined with use of a template shape 1050 shown in FIGS. 5A and 5B. In some implementations, the template shape 1050 may be rectangular or square in shape. In these implementations, the template shape 1050 includes a first side D1 and a second side D2. The template shape 1050 is rectangular when the first side D1 is different from the second side D2. The template shape 1050 is square when the first side D1 is the same as the second side D2. In some instances, each of the first side D1 and the second side D2 is between about 3 µm and about 10 µm, such as between about 4 µm and about 6 µm. Based on the assumption that probability of bubbling is proportional to the dimensions of the pattern-free area, the template shape 1050 represents the smallest reasonable area where bubbling is unlikely. Put differently, when a pattern-free area is smaller than the template shape 1050, vapor can be readily vented through neighboring patterns (i.e., openings) in a main feature area without tendency to generate a bubble. Reference is now made to FIGS. 5A and 5B. To determine a venting feature insertion area 1100, the template shape 1050 is repeatedly fitted by use of a computer system into a pattern-free area in the mask design without overlapping with any of the printing feature 1200 in the main feature area 120 until no more template shape 1050 can fit into the remainder of the pattern-free area. Because only complete template shapes 1050 are allowed to fit in a venting feature insertion area 1100, a venting feature insertion area 1100 includes an integer number of the template shape 1050. If a pattern-free area or a portion thereof can only accommodate a less-than-complete portion of the template shape 1050, that pattern-free area or portion thereof is excluded from the venting feature insertion area 1100.

Operations at block 204 may or may not take into consideration of a spacing S from the printing feature 1200. The spacing S represents the spacing between an edge of the printing feature 1200 and an edge of a venting feature to be inserted into the venting feature insertion area 1100 at block 206. In some instances, the spacing S is selected to prevent interference with the printing of the main feature area 120. In one embodiment represented in FIG. 5A, the spacing S from the edge of the printing feature 1200 is first determined and earmarked and then the template shape 1050 is repeatedly and non-overlappingly fitted into the pattern-free area outside of the spacing S. In another embodiment represented in FIG. 5B, the template shape 1050 is repeatedly and non-overlappingly fitted into the pattern-free area without first identifying the spacing S from the edge of the printing feature 1200. After the venting feature insertion area 1100 is determined, the spacing S is then excluded from the venting feature insertion area 1100. In some embodiments, the spacing S is between about 1 µm and about 1.5 µm.

Figure 6A:
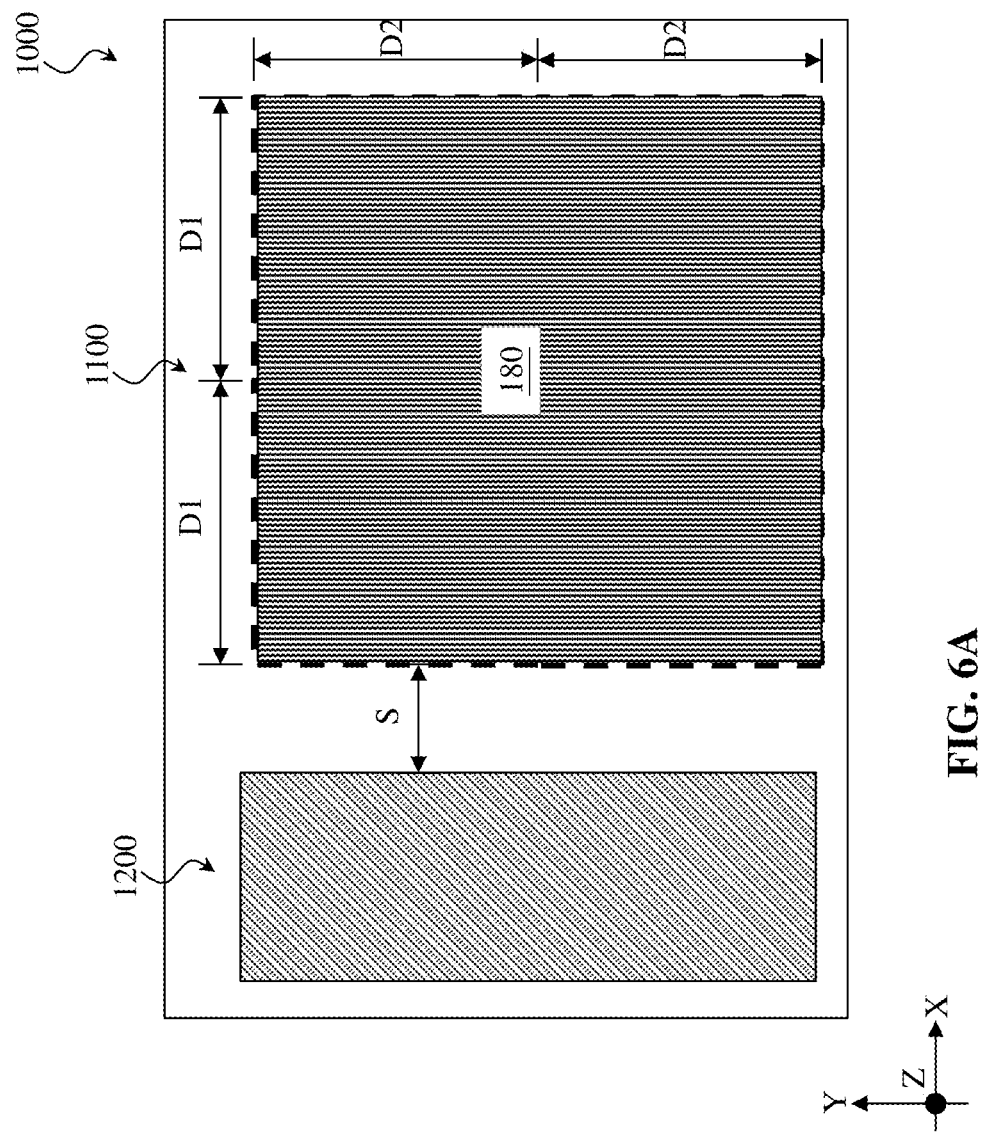
Figure 6B:
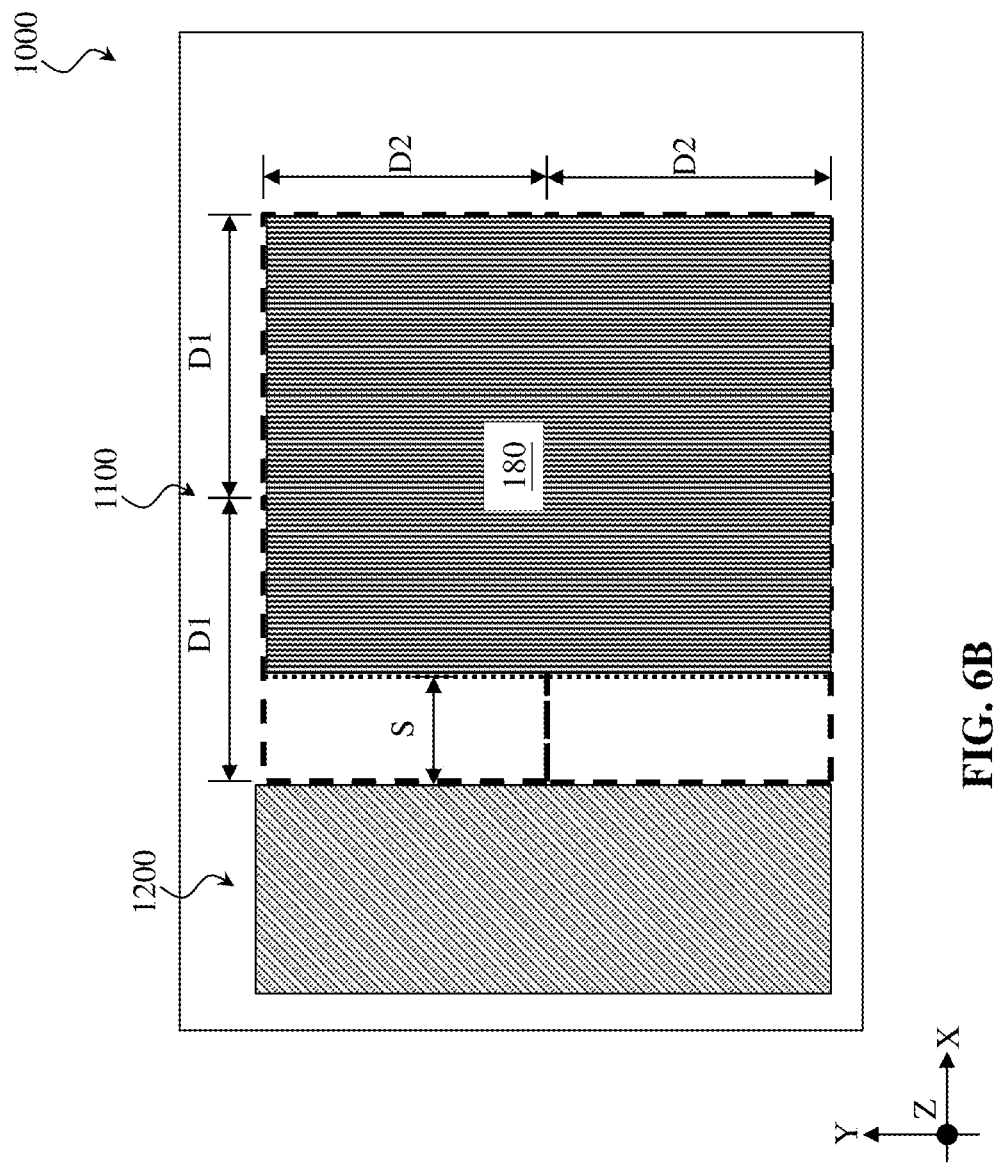
Figure 7C:
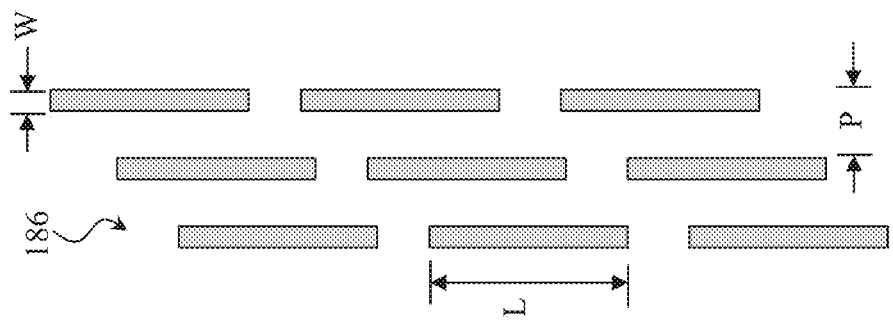
FIGS. 7A, 7B and 7C illustrate examples of venting features according to various aspects of the present disclosure.
Figure 7B:
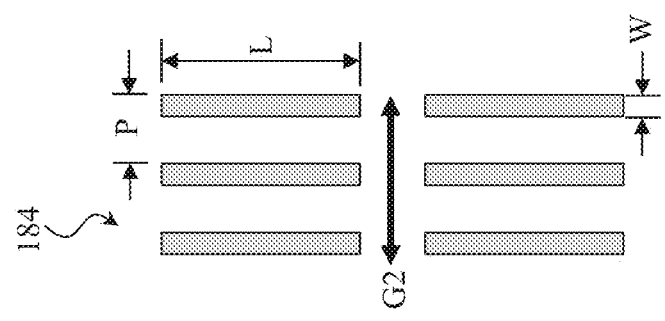
Figure 7A:
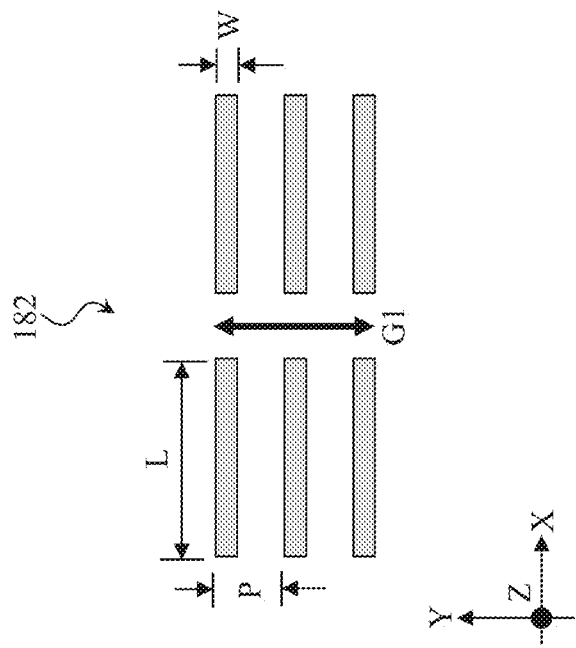

Referring to FIGS. 3, 6A, 6B, and 8, method 200 includes a block 206 where venting features 180 are inserted into the venting feature insertion area 1100 of the mask design 1000 to obtain a modified mask design 1000'. At block 206, a computer system may be used to insert venting features 180 into the venting feature insertion area 1100. Depending on how operations at block 204 are carried out, the venting features 180 may be inserted at block 206 to completely fill the venting feature insertion area 1100 as shown in FIG. 6A or partially fill the venting feature insertion area 1100, short of the area reserved for the spacing S from the edge of the printing feature 1200, as shown in FIG. 6B. The venting features 180 may be represented by various example repeating units shown in FIGS. 7A, 7B and 7C. Referring to FIG. 7A, a first repeating unit 182 may include a rectangular array of elongated bars, each of which extends lengthwise along the X direction. Each of the elongated bars has a length L along the X direction and a width W along the Y direction and the rectangular array of elongated bars has a Y direction pitch P. In some implementations represented in FIG. 7A, each of the elongated bars are aligned end-to-end along both the X direction and the Y direction. The elongated bars in FIG. 7A are parallel to one another along the X direction. Referring to FIG. 7B, a second repeating unit 184 may include a rectangular array of elongated bars, each of which extends lengthwise along the Y direction. Each of the elongated bars in the first repeating unit 182 may be substantially similar to one in the second repeating unit 184 but is rotated by 90 degrees. That is, each elongated bar in the second repeating unit 184 has a length L along the Y direction, a width W along the X direction and the elongated bars have an X-direction pitch P. Similar to the first repeating unit 182, the elongated bars in the second repeating unit 184 are aligned end-to-end along both the X direction and the Y direction. Different from elongated bars in FIG. 7A, the elongated bars in FIG. 7B are parallel to one another along the Y direction. A third repeating unit 186 shown in FIG. 7C includes a design different from those in FIGS. 7A and 7B. To prevent formation of a long-range gap G1 along the Y direction in FIG. 7A or a long-range gap G2 along the X direction in FIG. 7B, elongated bars in the third repeating unit 186 are aligned only along the Y direction but are misaligned about the X direction. Elongated bars in the third repeating unit 186 may have similar dimensions and pitch as those in the second repeating unit 184. Like elongated bars in the second repeating unit 184, elongated bars in the third repeating unit 186 are also parallel to one another along the Y direction.

The present disclosure contemplates both printing venting features 180 and sub-resolution (non-printing) venting features 180. As the names implies, printing venting features 180 reflect sufficient radiation (or with a sufficient intensity) to exceed an exposure threshold and thereby cause a photoresist layer on the target to transition from one state to another, allowing a pattern to be developed. On the contrary, sub-resolution venting features 180 do not reflect sufficient radiation (or with a sufficient intensity) to exceed an exposure threshold and thereby cause a photoresist layer on the target to transition from one state to another. In some embodiments where the venting features 180 are sub-resolution venting features, the length L is between about 100 nm and about 2 µm; the width W is between about 4 nm and about 12 nm; and the pitch P is between about 20 nm and about 200 nm. In these embodiments, venting feature insertion areas 1100 are determined in the main feature areas, the divider areas and the black border areas and venting features 180 are inserted in the venting feature insertion areas 1100. In some alternative embodiments where the venting features 180 are printing features, no venting feature insertion areas 1100 are determined in the main feature areas as presence of printing venting features may affect device performance. In these alternatively embodiments, the dimensions of the venting features 180 may be enlarged and the venting features 180 are only inserted into venting feature insertion areas in the divider areas 130 and the black border areas 140.

Figure 8:
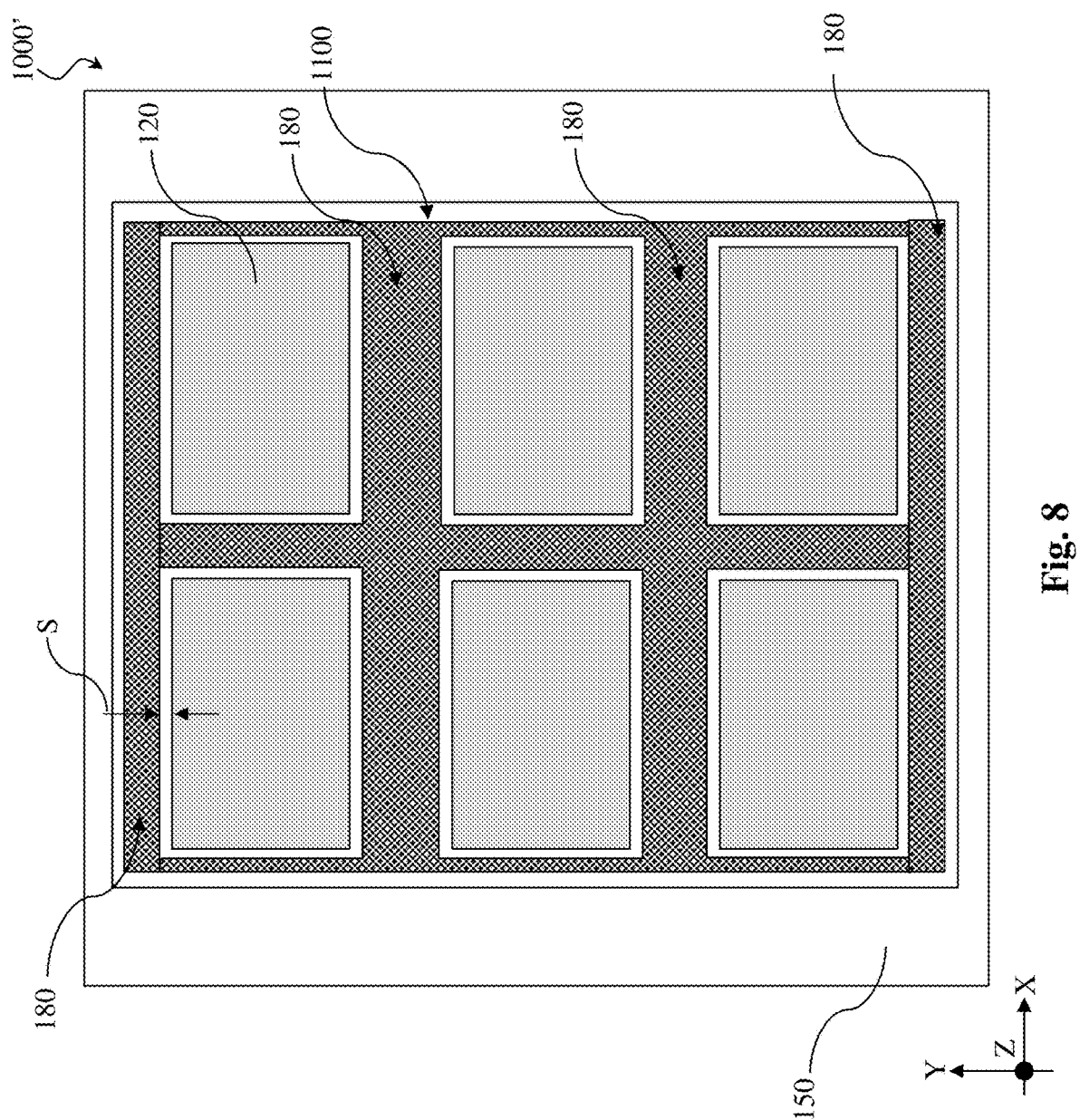

After the venting features 180 are inserted into the venting feature insertion areas 1100 determined in the main feature areas 120, the divider areas 130, and the black border areas 140 of the mask design 1000, a modified mask design 1000' as shown in FIG. 8 is obtained. It is noted that, for clarity and simplicity, venting features 180 that may be inserted into venting feature insertion area 1100 (if any is determined at block 204) in the main feature area 120 are omitted from FIG. 8. In embodiments where the venting features 180 are printing features, they are not inserted into the main feature areas 120.

Figure 9:
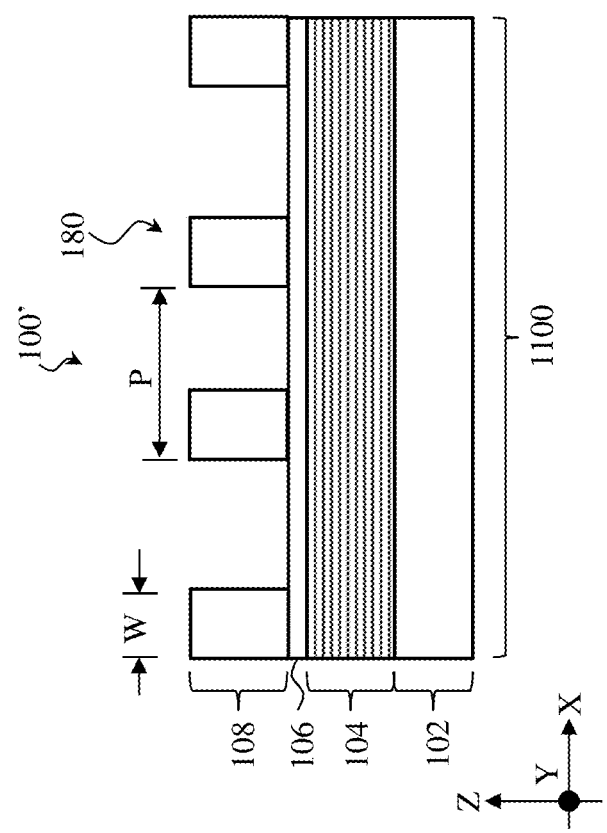
FIG. 9 is a fragmentary cross-sectional diagram of a mask substrate including venting features, according to various aspects of the present disclosure.

Referring to FIGS. 3 and 9, method 200 includes a block 208 where a modified mask 100' is fabricated based on the modified mask design 1000'. In some embodiments, the modified mask 100' may be fabricated using deposition techniques and electron-beam (E-beam) writing. In some embodiments, a mask blank including a mask substrate, an MLM layer over the substrate, a capping layer over the MLM layer, and a blank absorber layer over the MLM layer is received and an E-beam writer is used to pattern the absorber layer. A fragmentary cross-sectional view of a venting feature insertion area 1100 of the modified mask 100' is schematically illustrated in FIG. 9. The modified mask 100' includes venting features 180 in the venting feature insertion area 1100. The venting feature insertion area 1100 may be in the main feature areas (such as the main feature areas 120 shown in FIG. 4), the divider areas (such as the divider areas 130 shown in FIG. 4), or the black border areas (such as the black border areas 140 shown in FIG. 4). As a comparison, the mask 100 in FIG. 2 does not have any venting features 180 in pattern-free areas in the main feature areas, the divider areas, and the black border areas. In mask 100 in FIG. 2, the divider areas (such as the divider areas 130 shown in FIG. 4) and the black border areas (such as the black border areas 140 shown in FIG. 4) include a continuous absorber layer that is free of any pattern. In other words, the divider areas and the black border areas in mask 100 of FIG. 2 are free of openings that expose the underlying capping layer 106 or the MLM 104. In some embodiments, the modified mask 100' may be part of a mask assembly that also includes a pellicle frame similar to the pellicle 150 shown in FIG. 8.

Figure 10:
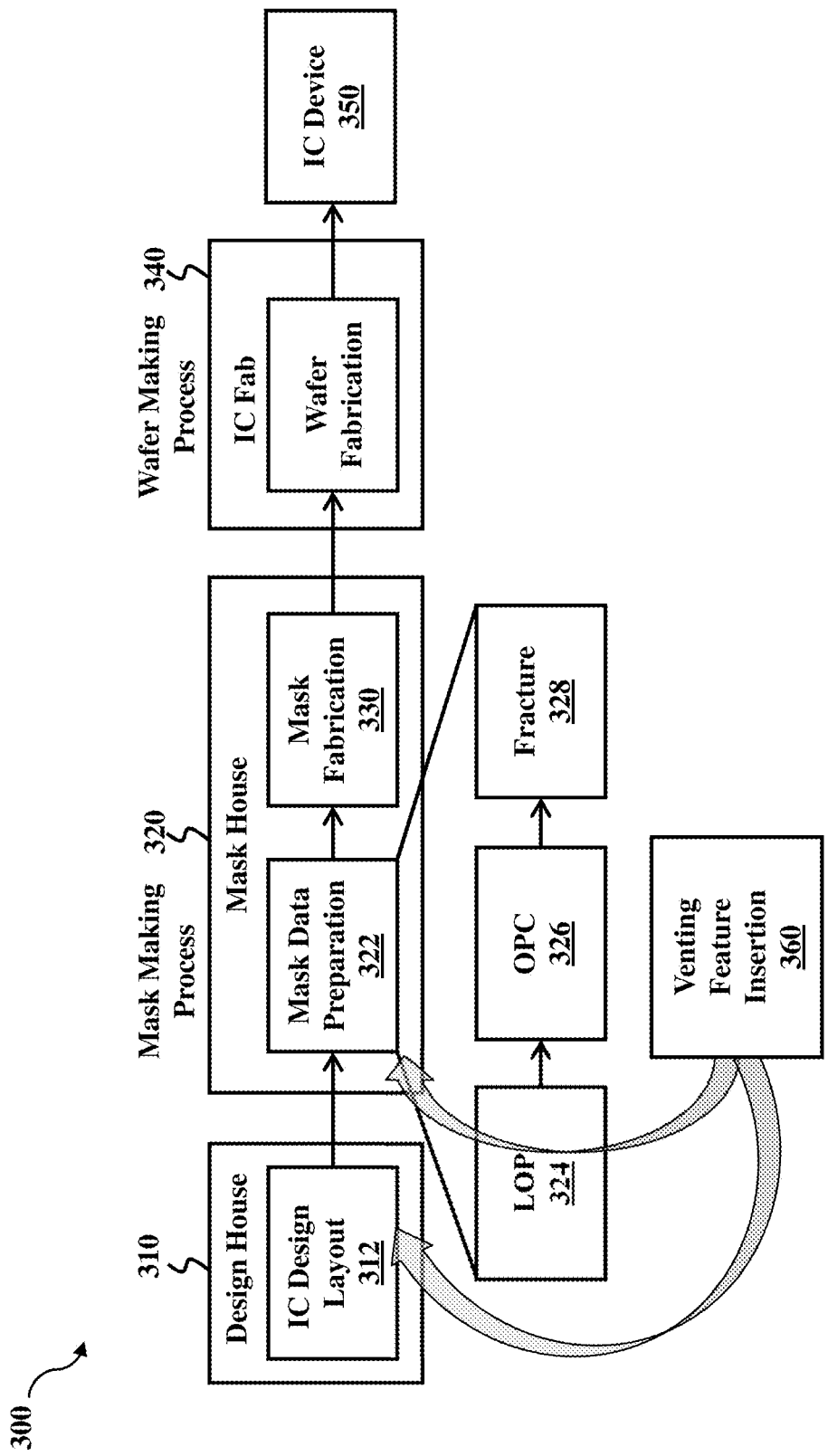
FIG. 10 is a block diagram of an integrated circuit (IC) manufacturing system, and an IC manufacturing flow associated therewith, according to various aspects of the present disclosure.

Methods of the present disclosure, such as method 200 in FIG. 3, may be implemented at any point between generation of an IC design layout and the actual fabrication of the mask(s). Reference is now made to FIG. 10, which illustrates a simplified block diagram of an integrated circuit (IC) manufacturing system 300 and associated IC manufacturing flow, which may benefit from various aspects of the present disclosure. The IC manufacturing system 300 includes a plurality of entities, such as a design house 310, a mask house 320, and an IC manufacturer 340 (i.e., an IC fab), that interact with one another in the design, development, and manufacturing cycles and/or services related to manufacturing an integrated circuit (IC) device 350. The plurality of entities is connected by a communications network, which may be a single network or a variety of different networks, such as an intranet and the Internet, and may include wired and/or wireless communication channels. Each entity may interact with other entities and may provide services to and/or receive services from the other entities. One or more of the design house 310, mask house 320, and IC manufacturer 340 may have a common owner, and may even coexist in a common facility and use common resources.

In various embodiments, the design house 310, which may include one or more design teams, generates an IC design layout 312. The IC design layout may include various geometrical patterns designed for the fabrication of the IC device 350. By way of example, the geometrical patterns may correspond to patterns of metal, oxide, or semiconductor layers that make up the various components of the IC device 350 to be fabricated. The various layers combine to form various features of the IC device 350. For example, various portions of the IC design layout may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house 310 implements a design procedure to form the IC design layout. The design procedure may include logic design, physical design, and/or placement and routing. The IC design layout 312 may be presented in one or more data files having information related to the geometrical patterns which are to be used for fabrication of the IC device 350. In some examples, the IC design layout 312 may be expressed in a GDSII file format or DFII file format.

In some embodiments represented in FIG. 10, venting features may be inserted into the IC design layout 312 at or by the design house 310. Methods of the present disclosure, such as method 200 in FIG. 3, may be performed and implemented as venting feature insertion 360. In these embodiments, because the venting features are spaced apart from the main features (i.e., printing features) and do not interfere with the printing of the main features, the design house 310 may insert them after the IC design layout 312 is generated.

In some embodiments, the design house 310 may transmit the IC design layout 312 to the mask house 320, for example, via the network connection described above. The mask house 320 may then use the IC design layout 312 to manufacture one or more masks to be used for fabrication of the various layers of the IC device 350 according to the IC design layout 312. In various examples, the mask house 320 performs mask data preparation 322, where the IC design layout 312 is translated into a form that can be physically written by a mask writer (such as an E-beam writer), and mask fabrication 330, where the design layout prepared by the mask data preparation is modified to comply with a particular mask writer and/or mask manufacturer and is then fabricated. In the example of FIG. 3, the mask data preparation 322 and mask fabrication 330 are illustrated as separate elements; however, in some embodiments, the mask data preparation 322 and mask fabrication 330 may be collectively referred to as mask preparation.

The mask data preparation 322 may include various sub-operations. For example, mask data preparation 322 may include logic operation (LOP) 324, optical proximity correction (OPC) 326, and fracture 328. In LOP 324, feature dimensions in IC design layout 312 may be adjusted to corresponding photoresist features in photolithography processes. In OPC 326, sub-resolution assist features (SRAF) and scattering bars may be inserted into the IC design layout 312 to enhance the exposure resolution. In fracture 328, features in IC design layout 312, sub-resolution assist features (SRAF) and scattering bars may be approximated by geometric shapes. The mask design 1000 described above with respect to the method 200 may correspond to the IC design layout 312 or modifications thereof after the LOP 324, the OPC 326, or fracture 328.

In some alternative embodiments represented in FIG. 10, venting features may be inserted at mask data preparation 322 by the mask house 320. In these alternative embodiments, the venting feature insertion 360 may be a sub-operation of mask data preparation 322 and may be performed along with LOP 324, OPC 326, or fracture 328, between LOP 324 and OPC 326, between OPC 326 and fracture 328, or between fracture 328 and mask fabrication 330.

After mask data preparation 322 and during mask fabrication 330, a mask or a group of masks may be fabricated based on the modified IC design layout (or modified mask design, such as the modified mask design 1000' in FIG. 9). For example, an electron-beam (e-beam) writer or a mechanism of multiple e-beams is used to form a pattern on a mask (photomask or reticle) based on the modified mask design. The mask can be formed in various technologies. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 340, such as a semiconductor foundry, uses the mask (or masks) fabricated by the mask house 320 to transfer one or more mask patterns onto a wafer and thus fabricate the IC device 350 on the wafer. The IC manufacturer 340 may include an IC fabrication facility that may include a myriad of manufacturing facilities for the fabrication of a variety of different IC products. For example, the IC manufacturer 340 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business (e.g., research and development).

The present disclosure presents multiple embodiments and multiple advantages. It is understood that the attribution of an advantage to an embodiment is merely for clarity and understanding. Different embodiments can offer different advantages, and no particular advantage is required for any one embodiment. For example, methods of the present disclosure allow insertion of venting features into pattern-free areas in a reflective mask to prevent bubbling of a radiation absorber layer, thereby reducing defects and improving lifetime of the reflective mask.

Thus, the present disclosure provides a photolithography mask with bubble-preventing venting features and a method for forming the mask. In one embodiment, a photolithographic mask assembly is provided. The photolithographic mask assembly includes a photolithographic mask. The photolithographic mask includes a capping layer over a substrate and an absorber layer disposed over the capping layer. The absorber layer includes a first main feature area, a second main feature area, and a first venting feature area disposed between the first main feature area and the second main feature area. The first venting feature area includes a plurality of venting features.

In some embodiments, the capping layer includes ruthenium, silicon oxide, and/or amorphous carbon. In some implementations, the absorber layer includes Cr, TaN, TaO, TaBN, TiN, TaBO, $Cr_2O_3$, $SiO_2$, or SiN. In some embodiments, the plurality of venting features includes a first plurality of elongated bars arranged in parallel. In some instances, dimensions of each of the first plurality of elongated bars are selected such that the first plurality of elongated members do not print in a photolithography process and the first plurality of elongated members do not affect printing of the first main feature area and the second main feature area in the photolithography process. In some embodiments, the photolithographic mask assembly may further include a pellicle frame disposed over the photolithographic mask. The pellicle frame includes an opening to expose a portion of the photolithographic mask and the photolithographic mask includes a black border area disposed between the first main feature area and the opening. In some implementations, the photolithographic mask assembly may further include a second venting feature area disposed within the black border area. In some embodiments, the second venting feature area includes a second plurality of elongated bars arranged in parallel.

In another embodiment, a method is provided. The method includes receiving a photolithographic mask design that includes a first main feature area, a second main feature area, and a divider area between the first main feature area and the second main feature area, determining a venting feature insertion area within the first main feature area, the second main feature area, and the divider area, respectively, inserting a plurality of venting features in the venting feature insertion area of the photolithographic mask design to create a modified photolithographic mask design, and fabricating a photolithographic mask based on the modified photolithographic mask design.

In some embodiments, the determining of the venting feature insertion area includes identifying a first pattern-free area in the first main feature area, the second main feature area, and the divider area as a portion of the venting feature insertion area if a template shape fits in the first pattern-free area, and excluding a second pattern-free area in in the first main feature area, the second main feature area, and the divider area from the venting feature insertion area if the template shape does not fit in the second pattern-free area. In some implementations, the template shape is rectangular and includes a side having a length between about 4 μm and about 6 μm. In some instances, the method may further include after the inserting of the plurality of venting features, performing optical proximity correction (OPC) to the modified photolithographic mask design. In some embodiments, the fabricating of the photolithographic mask includes receiving a mask substrate including a multi-layer mirror, a capping layer over the multi-layer mirror, and an extreme ultraviolet (EUV) absorber layer over the capping layer, and patterning the EUV absorber layer using an electron-beam writer. In some instances, the method may further include exposing the photolithographic mask to radiation, and using the radiation reflected from the first main feature area, the second main feature area, and the venting feature insertion area to expose a workpiece. In these instances, an intensity of the radiation reflected by the venting feature insertion area is maintained not to exceed an exposure threshold of a photoresist of the workpiece. In some embodiments, the exposing of the photolithographic mask to radiation includes exposing the photolithographic mask to extreme ultraviolet (EUV) radiation.

In yet another embodiment, a method is provided. The method includes receiving a photolithographic mask design having a plurality of printing features and a plurality of pattern-free areas; identifying, in the photolithographic mask design, a venting feature insertion area when a template shape fits within the plurality of pattern-free area; inserting a plurality of venting features in the venting feature insertion area of the photolithographic mask design to obtain a modified photolithographic mask design; and fabricating a photolithographic mask based on the modified photolithographic mask design.

In some embodiments, the method may further include after the inserting of the plurality of venting features and before the fabricating of the photolithographic mask, performing optical proximity correction (OPC) to the modified photolithographic mask design. In some implementations, the fabricating of the photolithographic mask includes receiving a mask substrate including a multi-layer mirror, a capping layer over the multi-layer mirror, and an extreme ultraviolet (EUV) absorber layer over the capping layer, and forming the plurality of venting features by completely removing the EUV absorber layer from at least a portion of the venting feature insertion area to expose the multi-layer mirror. In some instances, the EUV absorber layer includes Cr, TaN, TaO, TaBN, TiN, TaBO, $Cr_2O_3$, $SiO_2$, or SiN. In some embodiments, the plurality of venting features are elongated in shape and disposed in parallel with one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A photolithographic mask assembly, comprising:
a photolithographic mask comprising:
a capping layer over a substrate, and
an absorber layer disposed over the capping layer, wherein the absorber layer comprises:
a first main feature area,
a second main feature area, and
a first venting feature area disposed between the first main feature area and the second main feature area, wherein the first venting feature area comprises a plurality of venting features.

2. The photolithographic mask assembly of claim 1, wherein the capping layer comprises ruthenium, silicon oxide, and/or amorphous carbon.

3. The photolithographic mask assembly of claim 1, wherein the absorber layer comprises Cr, TaN, TaO, TaBN, TiN, TaBO, $Cr_2O_3$, $SiO_2$, or SiN.

4. The photolithographic mask assembly of claim 1, wherein the plurality of venting features comprises a first plurality of elongated bars arranged in parallel.

5. The photolithographic mask assembly of claim 4, wherein dimensions of each of the first plurality of elongated bars are selected such that the first plurality of elongated members do not print in a photolithography process,
wherein the first plurality of elongated members do not affect printing of the first main feature area and the second main feature area in the photolithography process.

6. The photolithographic mask assembly of claim 1, further comprising a pellicle frame,
wherein the pellicle frame is disposed over the photolithographic mask,
wherein the pellicle frame comprises an opening to expose a portion of the photolithographic mask,
wherein the photolithographic mask comprises a black border area disposed between the first main feature area and the opening.

7. The photolithographic mask assembly of claim 6, further comprising a second venting feature area disposed within the black border area.

8. The photolithographic mask assembly of claim 7, wherein the second venting feature area comprises a second plurality of elongated bars arranged in parallel.

9. A method, comprising:
receiving a photolithographic mask design comprising a first main feature area, a second main feature area, and a divider area between the first main feature area and the second main feature area;
determining a venting feature insertion area within the first main feature area, the second main feature area, and the divider area, respectively;
inserting a plurality of venting features in the venting feature insertion area of the photolithographic mask design to create a modified photolithographic mask design; and
fabricating a photolithographic mask based on the modified photolithographic mask design.

10. The method of claim 9, wherein the determining of the venting feature insertion area comprises:
identifying a first pattern-free area in the first main feature area, the second main feature area, and the divider area as a portion of the venting feature insertion area if a template shape fits in the first pattern-free area; and
excluding a second pattern-free area in in the first main feature area, the second main feature area, and the divider area from the venting feature insertion area if the template shape does not fit in the second pattern-free area.

11. The method of claim 10, wherein the template shape is rectangular and comprises a side having a length between about 4 μm and about 6 μm.

12. The method of claim 9, further comprising:
after the inserting of the plurality of venting features, performing optical proximity correction (OPC) to the modified photolithographic mask design.

13. The method of claim 9, wherein the fabricating of the photolithographic mask comprises:
receiving a mask substrate including a multi-layer mirror, a capping layer over the multi-layer mirror, and an extreme ultraviolet (EUV) absorber layer over the capping layer; and
patterning the EUV absorber layer using an electron-beam writer.

14. The method of claim 9, further comprising:
exposing the photolithographic mask to radiation; and
using the radiation reflected from the first main feature area, the second main feature area, and the venting feature insertion area to expose a workpiece, wherein an intensity of the radiation reflected by the venting feature insertion area is maintained not to exceed an exposure threshold of a photoresist of the workpiece.

15. The method of claim 14, wherein the exposing of the photolithographic mask to radiation comprises exposing the photolithographic mask to extreme ultraviolet (EUV) radiation.

16. A method, comprising:
receiving a photolithographic mask design comprising a plurality of printing features and a plurality of pattern-free areas;
identifying, in the photolithographic mask design, a venting feature insertion area when a template shape fits within the plurality of pattern-free area;
inserting a plurality of venting features in the venting feature insertion area of the photolithographic mask design to obtain a modified photolithographic mask design; and
fabricating a photolithographic mask based on the modified photolithographic mask design.

17. The method of claim 16, further comprising:
after the inserting of the plurality of venting features and before the fabricating of the photolithographic mask, performing optical proximity correction (OPC) to the modified photolithographic mask design.

18. The method of claim 16, wherein the fabricating of the photolithographic mask comprises:
receiving a mask substrate including a multi-layer mirror, a capping layer over the multi-layer mirror, and an extreme ultraviolet (EUV) absorber layer over the capping layer; and
forming the plurality of venting features by completely removing the EUV absorber layer from at least a portion of the venting feature insertion area to expose the multi-layer mirror.

19. The method of claim 18, wherein the EUV absorber layer comprises Cr, TaN, TaO, TaBN, TiN, TaBO, $Cr_2O_3$, $SiO_2$, or SiN.

20. The method of claim 18, wherein the plurality of venting features are elongated in shape and disposed in parallel with one another.

\* \* \* \* \*